United States Patent
Choi

(10) Patent No.: US 7,548,108 B2
(45) Date of Patent: Jun. 16, 2009

(54) SEMICONDUCTOR INTEGRATED CIRCUIT DEVICE WITH DUAL INSULATION SYSTEM

(75) Inventor: Jong-Hyun Choi, Suwon-si (KR)

(73) Assignee: Sumsung Electronics Co., Ltd., Gyeonggi-do (KR)

( * ) Notice: Subject to any disclaimer, the term of this patent is extended or adjusted under 35 U.S.C. 154(b) by 429 days.

(21) Appl. No.: 10/761,239

(22) Filed: Jan. 22, 2004

(65) Prior Publication Data
US 2004/0184338 A1 Sep. 23, 2004

(30) Foreign Application Priority Data
Feb. 10, 2003 (KR) ............ 10-2003-0008200

(51) Int. Cl.
*H03K 19/0175* (2006.01)
*H03K 5/02* (2006.01)
(52) U.S. Cl. ............ 327/374; 327/208; 327/328; 326/81; 326/112
(58) Field of Classification Search ............ None
See application file for complete search history.

(56) References Cited

U.S. PATENT DOCUMENTS

| | | | | |
|---|---|---|---|---|
| 5,031,149 A * | 7/1991 | Matsumoto et al. | .... | 365/185.23 |
| 6,009,023 A | 12/1999 | Lu et al. | ............ | 365/189.11 |
| 6,128,230 A * | 10/2000 | Amanai | ............ | 365/185.23 |
| 6,333,662 B1 * | 12/2001 | Umezawa et al. | ............ | 327/333 |
| 6,490,222 B2 * | 12/2002 | Choi et al. | ............ | 365/201 |
| 6,510,084 B2 * | 1/2003 | Ha | ............ | 365/185.25 |
| 6,534,806 B1 * | 3/2003 | Wert | ............ | 257/213 |
| 6,580,306 B2 * | 6/2003 | Hardee | ............ | 327/328 |
| 6,614,283 B1 * | 9/2003 | Wright et al. | ............ | 327/333 |
| 6,642,769 B1 * | 11/2003 | Chang et al. | ............ | 327/333 |
| 6,650,168 B1 * | 11/2003 | Wang et al. | ............ | 327/333 |
| 6,704,226 B2 * | 3/2004 | Lee | ............ | 365/200 |
| 6,768,689 B2 * | 7/2004 | Origasa | ............ | 365/189.11 |
| 6,774,696 B2 * | 8/2004 | Clark et al. | ............ | 327/333 |

OTHER PUBLICATIONS

Korean Office Action dated Apr. 29, 2005 with English Translation.

* cited by examiner

*Primary Examiner*—Lincoln Donovan
*Assistant Examiner*—Terry L Englund
(74) *Attorney, Agent, or Firm*—Harness, Dickey & Pierce, P.L.C.

(57) ABSTRACT

A semiconductor integrated circuit device may include a first internal circuit operating at a first voltage higher than a power supply voltage of the device, and a second internal circuit operating at a second voltage lower than the first voltage. An interface circuit may be provided to restrict a voltage transferred from the first internal circuit to the second internal circuit. The first internal circuit may include a metal oxide semiconductor (MOS) transistor having a relatively thick gate insulation layer, and the second internal circuit may have a MOS transistor having a relatively thin gate insulation layer. The interface circuit, by restricting voltage, may reduce an electric field applied to the gate insulation layer of the second MOS transistor in an effort to prevent a reduction in turn-on speed of the second MOS transistor.

10 Claims, 9 Drawing Sheets

($V_{GD}$ : Gate-drain voltage difference of MN2)

SEMICONDUCTOR INTEGRATED CIRCUIT DEVICE WITH DUAL INSULATION SYSTEM

PRIORITY STATEMENT

This application claims the priority of Korean Patent Application No. 2003-8200, filed on Feb. 10, 2003 in the Korean Intellectual Property Office, the disclosure of which is incorporated herein in its entirely by reference.

BACKGROUND OF THE INVENTION

1. Field of the Invention

The present invention relates to a semiconductor integrated circuit device using a power supply voltage and other operation voltages.

2. Description of Related Art

Electronic apparatuses such as a personal digital assistant (PDA), a notebook computer or a mobile phone operate with a power supplied from a battery. Users desire to use these electronic apparatuses for a longer time without recharge, which can be achieved by lowering operation current or operation voltage. In addition, state-of-the-art electronic apparatuses require higher operation speed. These state-of-the-art electronic apparatuses employ semiconductor integrated current devices that include transistors such as metal-oxide-semiconductor (MOS) transistors. In order to achieve higher speed, it is desirable for a gate insulation layer of a MOS transistor to be formed so as to be of a relatively thin layer.

Additionally, an electronic apparatus operating with a lower operation voltage includes a number of semiconductor integrated circuit devices. The semiconductor integrated circuit device typically receives an external power supply voltage, may have an internal power supply voltage, and may uses a voltage higher than the external or internal power supply voltage. A relatively thick gate insulation layer is used in a MOS transistor operating with a high voltage, so as to enhance a withstanding voltage relative to the high voltage. On the other hand, a relatively thin insulation layer is used in a MOS transistor operating at a voltage other than (such as less than) the high voltage. Such an insulation system is referred to as a "dual insulation system".

In the case where a relatively thick gate insulation layer is employed, it is possible to prevent the gate insulation layer from being broken due to a gate-drain voltage difference of a MOS transistor. The thicker the gate insulation layer is, the higher a threshold voltage of the MOS transistor. When the threshold voltage of the MOS transistor rises, turn-on speed of the MOS transistor may be lowered. This may cause a reduction in system operation speed.

SUMMARY OF THE INVENTION

Exemplary embodiments of the present invention are directed to a semiconductor integrated circuit device. In an exemplary embodiment, the device may include a first internal circuit operating at a first voltage higher than a power supply voltage of the device, and a second internal circuit operating at a second voltage lower than the first voltage. An interface circuit may be provided to restrict a voltage transferred from the first internal circuit to the second internal circuit. The first internal circuit may include a metal oxide semiconductor (MOS) transistor having a relatively thick gate insulation layer, and the second internal circuit may include a MOS transistor having a relatively thin gate insulation layer. The interface circuit, by restricting voltage, may reduce an electric field applied to the gate insulation layer of the second MOS transistor in an effort to prevent a reduction in turn-on speed of the second MOS transistor.

DETAILED DESCRIPTION OF THE EXEMPLARY EMBODIMENTS

Figure 1:
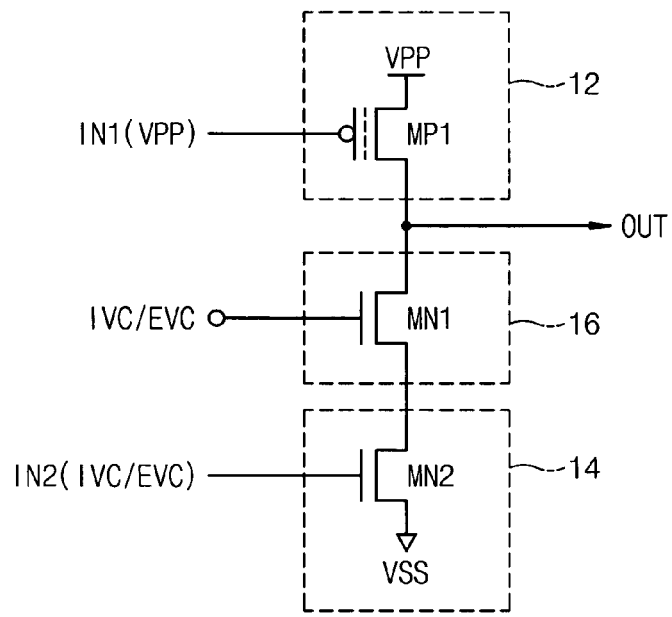
FIG. 1 is a circuit diagram of a semiconductor integrated circuit device according to an exemplary embodiment of the present invention.

FIG. 1 is a circuit diagram of a semiconductor integrated circuit device according to an exemplary embodiment of the present invention. A semiconductor integrated circuit 10 outputs an output signal OUT in response to input signals IN1 and IN2. Semiconductor integrated circuit 10 may include a first internal circuit 12, second internal circuit 14 and interface circuit 16. The first internal circuit 12 may operate at a higher voltage VPP than an internal power supply voltage IVC (or than an external power supply voltage EVC), while the second internal circuit 14 and the interface circuit 16 may operate at the internal power supply voltage IVC (or the external power supply voltage EVC). The internal power supply voltage IVC may equal the external power supply voltage EVC. Alternatively, the internal power supply voltage IVC may be less than the external power supply voltage EVC. The interface circuit 16 may limit a voltage that is applied from the first internal circuit 12 to the second internal circuit 14, or a voltage applied from an output terminal OUT to the second internal circuit 14. The interface circuit 16 may therefore act as a voltage-limiting means in the device 10.

The first internal circuit 12 may include a PMOS transistor MP1 having a relatively thick gate insulation layer, so as to have a sufficient withstand voltage relative to a high voltage VPP. The PMOS transistor MP1 is coupled so as to enable its gate to receive an input signal IN1, has a source coupled to a power terminal receiving the high voltage VPP, and has a drain coupled to the output terminal OUT.

The interface circuit 16 may include an NMOS transistor MN1 having a relatively thin gate insulation layer, so as to have a withstand voltage relative to the IVC/EVC voltage. The NMOS transistor MN1 has a gate coupled to the IVC/EVC voltage, a drain coupled to the output terminal OUT, and a source coupled to the second internal circuit 14.

The second internal circuit 14 may include an NMOS transistor MN2 having a relatively thin gate insulation layer, so as to have a withstand voltage relative to the IVC/EVC voltage. The NMOS transistor MN2 is coupled so its gate can receive an input signal IN2, has a drain coupled to the source of the NMOS transistor MN1, and has a source coupled to a ground voltage VSS.

The input signal IN1 may selectively have a ground voltage VSS and a high voltage VPP. The input signal IN2 may selectively have a ground voltage VSS and an internal power supply voltage IVC (or external power supply voltage EVC).

The NMOS transistor MN1 of the interface circuit 16 prevents a high voltage supplied through a PMOS transistor MP1 from being directly applied to the drain of the NMOS transistor MN2. That is, since a voltage of the output terminal OUT is transferred through the NMOS transistor MN1 (whose gate is coupled to the IVC/EVC voltage), a voltage of IVC/EVC-Vtn1 instead of the high voltage VPP is applied to the drain of the NMOS transistor MN2, where Vtn1 denotes a threshold voltage of an NMOS transistor having a relatively thin gate insulation layer. Since the IVC/EVC is always applied to the gate of the NMOS transistor MN1, a gate-drain voltage difference of the NMOS transistor MN1 is VPP-IVC/EVC. Therefore, although the NMOS transistor MN1 has the relatively thin gate insulation layer, a gate insulation layer of the NMOS transistor MN1 is not broken by the high voltage VPP.

Figure 2:
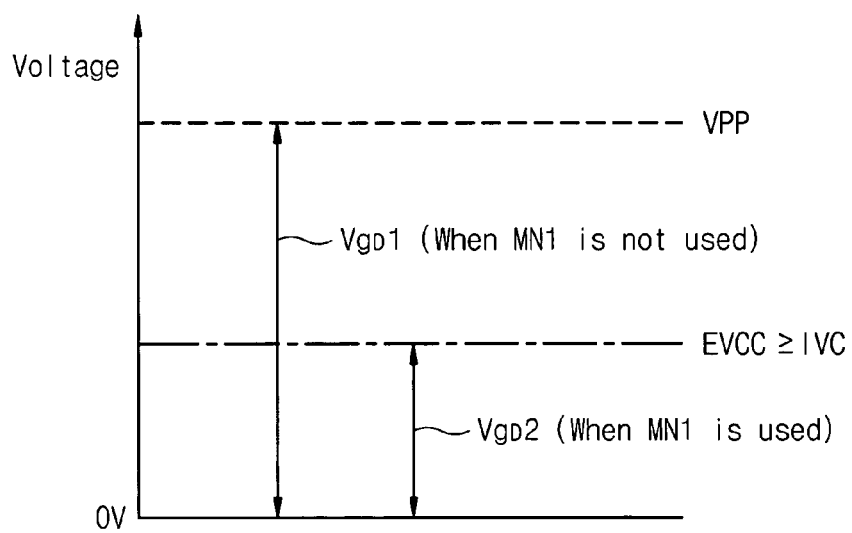
FIG. 2 is a diagram for explaining a difference between voltages applied to a gate insulation layer in a MOS transistor shown in FIG. 1.

FIG. 2 is a diagram for explaining a difference between voltages applied to a gate insulation layer in a MOS transistor shown in FIG. 1. If the NMOS transistor MN1 is not used, a gate-drain voltage difference Vgd1 of the NMOS transistor MN2 is the maximum VPP voltage, as shown in FIG. 2. This means that, in a case where an NMOS transistor MN2 with a relatively thin gate insulation layer is used, the gate insulation layer of the NMOS transistor MN2 is broken. Thus, it is desired that the NMOS transistor MN2 have a relatively thick gate insulation layer. In this case, the input signal IN2 of the NMOS transistor MN2 has a high voltage VPP during an active state. If not, the turn-on speed of the NMOS transistor MN2 may be lowered.

On the other hand, when the NMOS transistor MN1 is used, a gate-drain voltage difference Vgd2 of the NMOS transistor MN2 is the maximum IVC voltage (when IVC is lower than EVC), as shown in FIG. 2. When the IVC is equivalent to the EVC, the gate-drain voltage difference Vgd2 of the NMOS MN2 is IVC-Vtnh. In other words, an electric field applied to the gate insulation layer of the NMOS transistor MN2 may be alleviated. Therefore, the NMOS transistor MN1 may be used as an interface (or for attenuating an electric field) and may be arranged between the internal circuits 12 and 14. NMOS transistor MN1 prevents the gate insulation layer of the NMOS transistor MN2 from being broken by applying a high voltage to the drain of NMOS transistor MN2, as well as to prevent any lowering of the turn-on speed of the NMOS transistor MN2.

Figure 3:
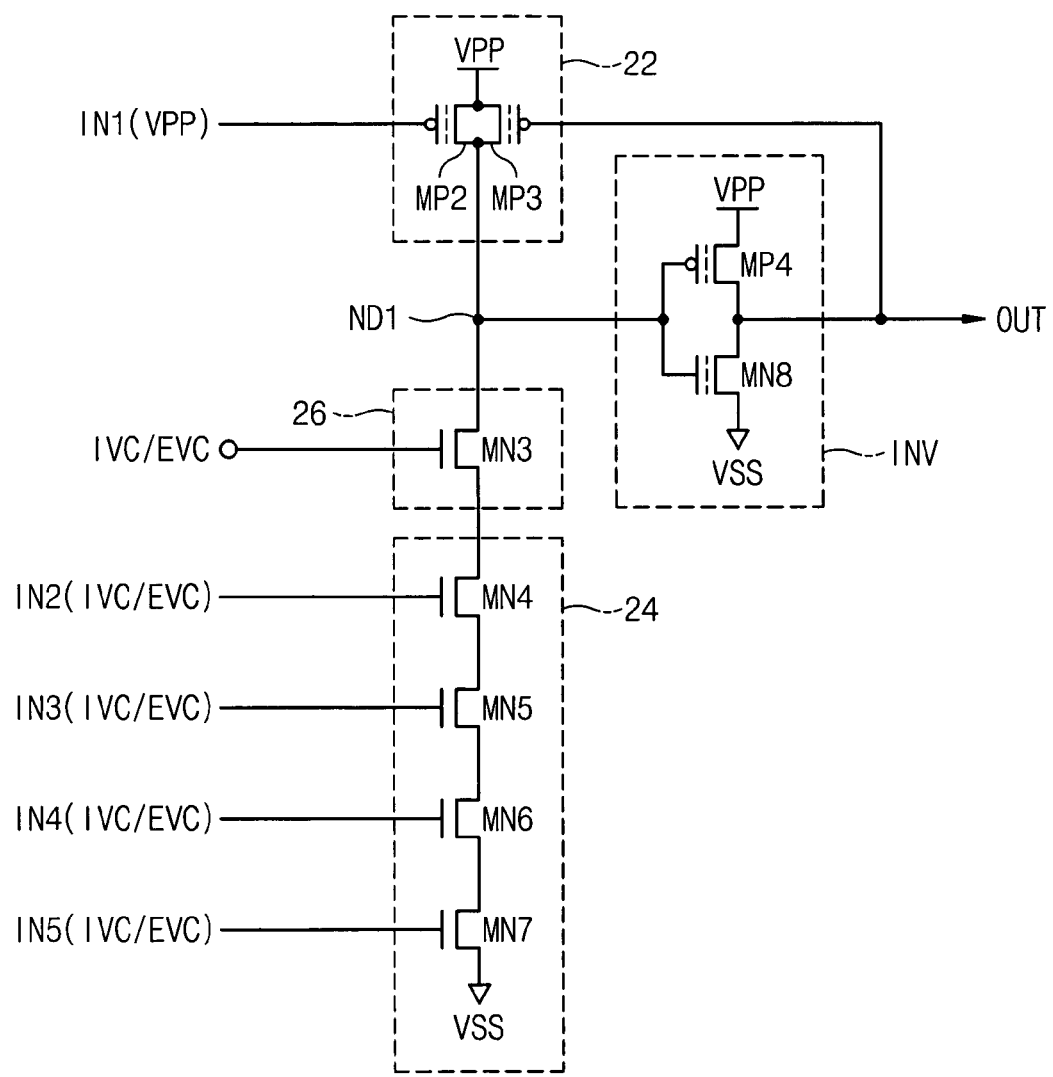
FIG. 3 is a circuit diagram of a semiconductor integrated circuit device according to another exemplary embodiment of the present invention.

FIG. 3 is a circuit diagram of a semiconductor integrated circuit device according to another exemplary embodiment of the present invention. In FIG. 3, a semiconductor integrated circuit device 20 includes circuit 26 that limits a voltage applied from a first internal circuit 22 to a second internal circuit 24, and which acts as a voltage-limiting means (or a field-alleviating means). The first internal circuit 22 may include PMOS transistors MP2 and MP3, at least one or both having a relatively thick gate insulation layer, so as to have a sufficient withstand voltage relative to a high voltage VPP. The PMOS transistor MP2 has a source coupled to the high voltage VPP, a drain coupled to an internal node ND1, and a gate coupled to receive an input signal IN1. The input signal IN1 may selectively have a high voltage VPP and a ground voltage VSS. The PMOS transistor MP3 has a source coupled to the high voltage VPP, a drain coupled to the internal node ND1, and a gate coupled to an output terminal OUT.

The interface circuit 26 may include an NMOS transistor MN3 with a relatively thin gate insulation layer, so as to have a sufficient withstand voltage relative to an internal power supply voltage IVC or relative to an external power supply voltage EVC. The NMOS transistor MN3 has a gate coupled to an internal power supply voltage IVC or an external power supply voltage EVC, a drain coupled to an internal node ND1, and a source coupled to the second internal circuit 24.

The second internal circuit 24 may include NMOS transistors MN4, MN5, MN6 and MN7, each with a relatively thin gate insulation layer so as to have a sufficient withstand voltage relative to an internal power supply voltage IVC or relative to an external power supply voltage EVC. The NMOS transistors MN4-MN7 may be serially coupled between the interface circuit 26, i.e., between the source of the NMOS transistor MN3 and the ground voltage VSS, and may be controlled by corresponding input signals IN2, IN3, IN4 and IN5. Each of the input signals IN2-IN5 may have an internal power supply voltage IVC or an external power supply voltage EVC in an active state, and may have a ground voltage VSS in an inactive state.

An inverter INV may be coupled between an internal node ND1 and an output terminal OUT. The INV may include PMOS transistor MP4 and NMOS transistor MN8. Each of the transistors MP4 and MN8 may have a relatively thick gate insulation layer so as to have a sufficient withstand voltage relative to a high voltage VPP. The PMOS and NMOS MP4 and MN8 may be serially coupled between a high voltage VPP and a ground voltage VSS. Gates of the PMOS and NMOS transistors MP4 and MN8 may be commonly connected to an internal node ND1, as shown in FIG. 3.

Referring again to FIG. 3, in operation, when an input signal IN1 is at a low level of ground voltage VSS and at least one of input signals IN2-IN5 is at a low level of a ground voltage VSS, internal node ND1 may be precharged to high voltage VPP through PMOS transistor MP2. In this case, the output signal OUT becomes a low level of the ground voltage VSS, so that PMOS transistor MP3 is also turned on. Since the gate of NMOS transistor MN4 (coupled to an internal power supply voltage IVC or an external power supply voltage EVC) is always in a turn-on state, a voltage of IVC-Vtn1 is applied to the drain of NMOS transistor MN4 through NMOS transistor MN3. That is, a voltage applied to the drain of the NMOS transistor MN4 is restricted by NMOS transistor MN3 of the interface circuit 26. Accordingly, although NMOS transistor MN4 has a relatively thin gate insulation layer, the gate insulation layer of the NMOS transistor MN4 is not broken by the high voltage VPP, and a turn-on speed of NMOS transistor NM4 does not need to be lowered. Similarly, since IVC/EVC is always applied to the gate of the NMOS transistor MN3, a gate-drain voltage difference of NMOS transistor MN3 is VPP-IVC/EVC. Although NMOS transistor MN3 has a relatively thin gate insulation layer, the gate insulation layer of the NMOS transistor MN3 is not broken by the high voltage VPP.

Figure 4:
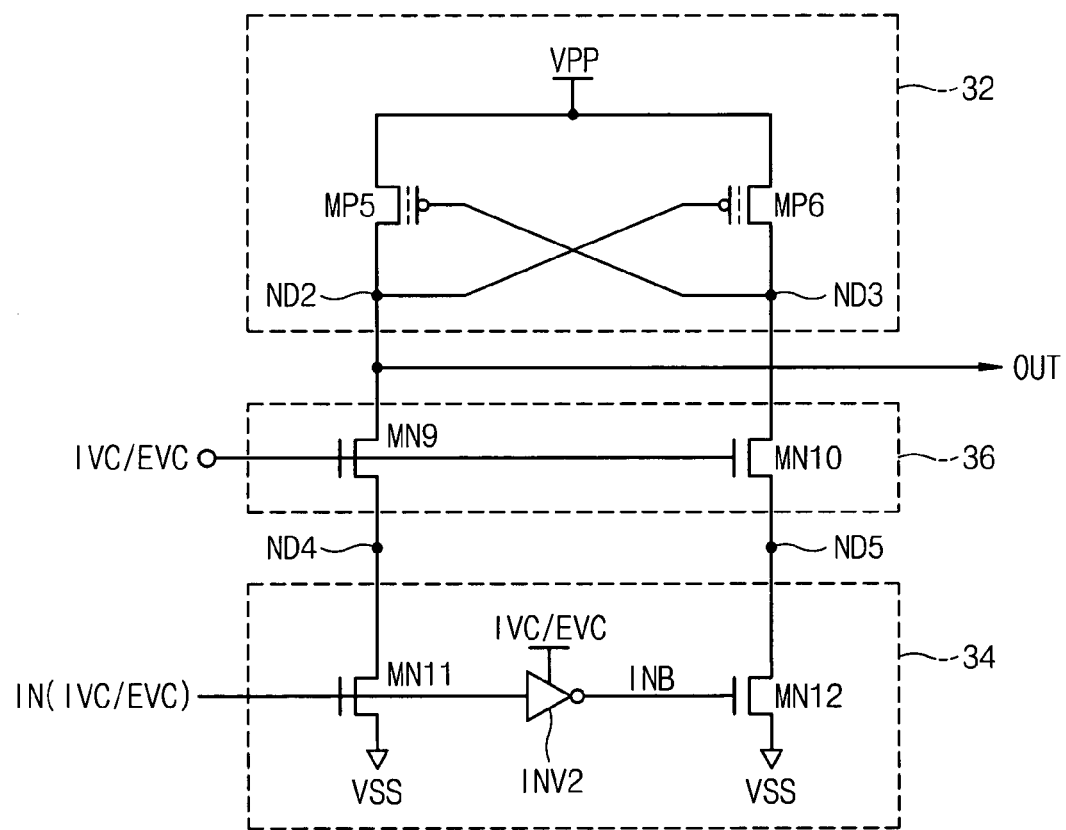
FIG. 4 is a circuit diagram of a semiconductor integrated circuit device according to another exemplary embodiment of the present invention.

When an input signal IN1 has a high level a high voltage VPP and input signals IN2-IN5 have a high level of IVC/EVC, voltage of the internal node ND1 is discharged through interface circuit 26 and second internal circuit 24, i.e., NMOS transistors MN3-MN7. The output signal OUT has a high level through inverter INV1. FIG. 4 is a circuit diagram of a semiconductor integrated circuit device according to another exemplary embodiment of the present invention. In FIG. 4, a semiconductor integrated circuit device 30 includes a first internal circuit 32. The first internal circuit 32 includes PMOS transistors MP5 and MP6 with a relatively thick gate insulation layer, so as to have a sufficient withstand voltage relative to the high voltage VPP. The PMOS transistor MP5 has a source coupled to the high voltage VPP, a drain coupled to the internal node ND2, and a gate coupled to an internal node ND3. The PMOS transistor MP6 has a source coupled to the high voltage VPP, a drain coupled to the internal node ND3, and a gate coupled to the internal node ND2.

The semiconductor integrated circuit device 30 also includes a second internal circuit 34. The second internal circuit 34 includes NMOS transistors MN11 and MN12 and an inverter INV2, and may operate with an internal power supply voltage IVC or with an external power supply voltage EVC, for example. Each of the NMOS transistors MN11 and MN12 has a relatively thin gate insulation layer, so as to have a sufficient withstand voltage relative to an internal power supply voltage IVC, or relative to an external power supply voltage EVC. The NMOS transistor MN11 has a drain coupled to an internal node ND4, a source coupled to a ground voltage VSS, and a gate connected to receive an input signal IN. The NMOS transistor MN12 has a drain coupled to an internal node ND5, a source coupled to a ground voltage VSS, and a gate connected to receive an inverted input signal INB through an inverter INV2. The inverter INV2 operates with an internal power supply voltage IVC or with an external power supply voltage EVC. Inverter INV2 may include PMOS and NMOS transistors (not shown) with a relatively thin gate insulation layer.

The semiconductor integrated circuit device 30 also includes an interface circuit 36. The interface circuit 36 reduces an electric field applied to a gate insulation layer of NMOS transistors MN11 and MN12, and restricts a voltage applied from the internal node ND2 or ND3 to the second internal circuit 34. The interface circuit 36 may include NMOS transistors MN9 and MN10, each with a relatively thin gate insulation layer so as to have a sufficient withstand voltage relative to an internal power supply voltage IVC, or relative to an external power supply voltage EVC. The NMOS transistor MN9 may be coupled between internal nodes ND2 and ND4, and the NMOS transistor MN10 is coupled between internal nodes ND3 and ND5. Gates of NMOS transistors MN9 and MN10 may be commonly coupled to an internal power supply voltage IVC or an external power supply voltage EVC, for example.

In operation, when an input signal IN is at a low level, NMOS transistor MN11 is turned off and MOS transistor MN12 is turned on. Since the ND3 node goes to a low level through NMOS transistors MN10 and MN12, PMOS transistor MP5 is turned on and an output signal goes to a high level of high voltage VPP. When the input signal is at a high level, the NMOS transistor MN12 is turned off and the NMOS transistor MN11 is turned on. Since the ND2 node goes to a low level through NMOS transistors MN9 and MN11, the PMOS transistor MP6 is turned on and an output signal OUT goes to a low level of ground voltage VSS.

Since each of NMOS transistors MN9 and MN10 has a gate coupled to an internal power supply voltage IVC and an external voltage is always turned on, a voltage IVC/EVC-Vtn1 is applied to NMOS transistors MN11 or MN12, through NMOS transistor MN9 or MN10. In other words, a voltage applied to the drain of either NMOS transistor MN11 or MN12 is restricted by NMOS transistor MN9 or MN10 of the interface circuit 36. Accordingly, although NMOS transistors MN11 and MN12 each have a relatively thin gate insulation layer, the gate insulation layers of NMOS transistors MN11 and MN12 are not broken by the high voltage VPP. Further, since each of the NMOS transistors MN11 and MN12 has a relatively thin gate insulation layer, the turn-on speed of the NMOS transistors MN11 and MN12 is not reduced. Likewise, since IVC/EVC is always applied to the gates of the NMOS transistors MN9 and MN10, a gate-drain voltage difference of the respective NMOS transistors MN9 and MN10 is VPP-IVC/EVC. Although the NMOS transistor MN9 and MN10 have relatively thin gate insulation layers, the gate insulation layers of the NMOS transistors MN9 and MN10 are not broken by the high voltage VPP.

Figure 5:
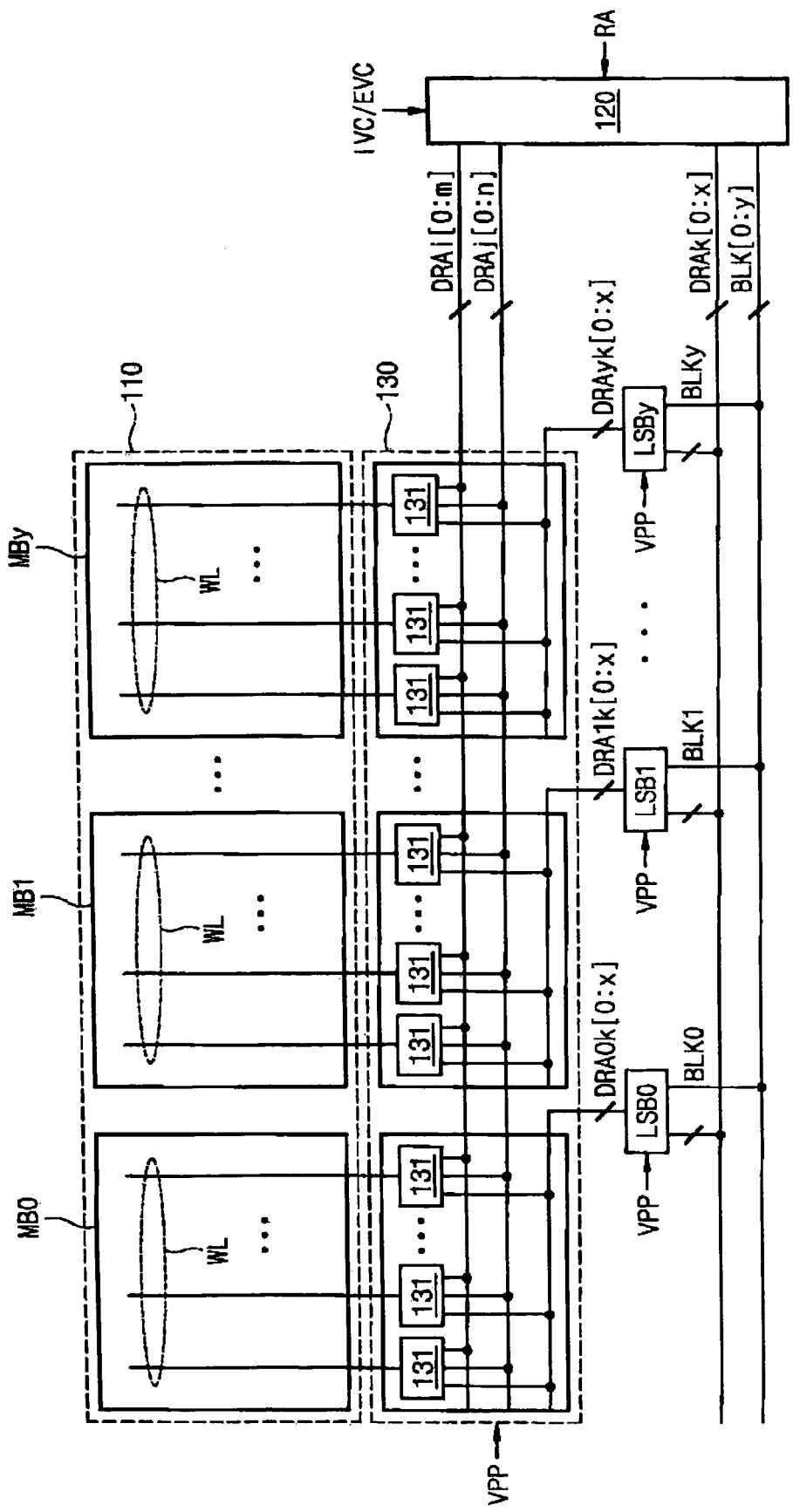
FIG. 5 is a block diagram of a semiconductor memory device employing the semiconductor integrated circuit device according to an exemplary embodiment of the present invention.

FIG. 5 is a block diagram of a semiconductor memory device employing the semiconductor integrated circuit device according to an exemplary embodiment of the present invention. Referring to FIG. 5, semiconductor memory device 100 may include a memory cell array 110 having a plurality of memory blocks MB0, MB1, . . . , and MBy. Each of the memory blocks MB0, MB1, . . . , and MBy may include memory cells disposed in a matrix of rows (or word lines) or columns (bit lines). A row predecoder 120 generates decoding signals DRAi[0:m], DRAj[0:n], and DRAk[0:x] and block selecting signals BLK[0:y]. The block selecting signals BLK[0:y] correspond to the memory blocks MB0-MBy. The decoding signals DRAi[0:m], DRAj[0:n], and DRAk[0:x] may be used to select one of the word lines of a selected memory block.

The semiconductor memory device 100 may include a plurality of level shift blocks LSB0, LSB1, . . . , and LSBy, each corresponding to memory blocks MB0-MBy. Each of the level shift blocks LSB0-LSBy inputs a corresponding a block selecting signal BLK[O:Y] and a decoding signal DRAk[0:x]. For example, the level shift block LSB0 inputs the block selecting signal BLK0 and the decoding signals DRAk[0:x], the level shift block LSB1 inputs the block selecting signal BLK1 and the decoding signals DRAk[0:x], and the level shift block LSBy inputs the block selecting signal BLKy and the decoding signals DRAk[0:x].

During an active state, input signals of the level shift blocks LSB0-LSBy each may be at an internal power supply voltage IVC, or at an external power supply voltage EVC. The level shift blocks LSB0-LSBy output decoding signals (including block selecting information) in response to the input signals. For example, the level shift block LSB1 outputs decoding signals DRA1$k$[0:x] in response to input signals, and the level shift block LSBy outputs decoding signals DRAy$k$[0:x] in response to input signals.

The semiconductor memory device 100 further includes row decoder and driver blocks 130_0, 130_1, . . . , and 130_y, each corresponding the memory blocks MB0, MB1, . . . , and MBy. The row decoder and driver blocks 130_0, 130_1, . . . , and 130_y operate with a high voltage VPP. Each of the row decoder and driver circuits 131 drives a corresponding word line in response to a part of the decoding signals DRAi[0:m] and DRAj[0:n] from the row predecoder 120 and a part of the decoding signals (e.g., DRA0$k$[0:x] from a corresponding level shift block (e.g., LSB0).

The level shift blocks and the row decoder and driving blocks according to the exemplary embodiments of the present invention may be implemented using a dual circuit device of a dual insulation system, as described in any of FIG. 1, FIG. 3 and FIG. 4, for example. As shown in FIG. 5, output signals of the respective level shift blocks may only be input to corresponding memory blocks, in an effort to reduce power consumption.

Figure 6:
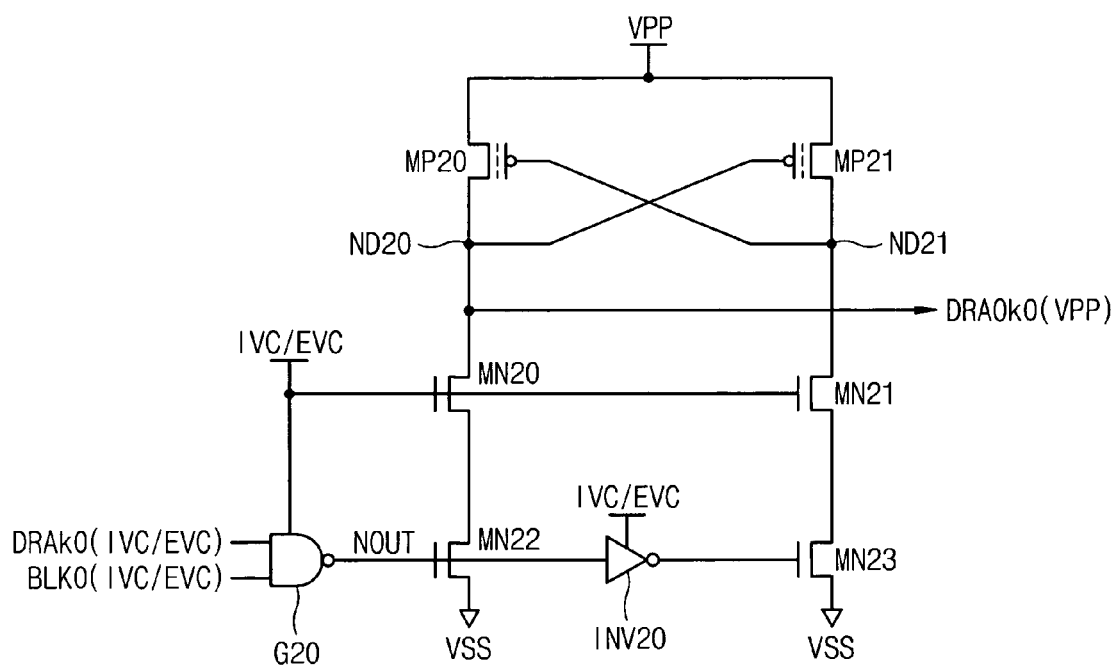
FIG. 6 is a circuit diagram showing a portion of a level shift block shown in FIG. 5.

FIG. 6 is a circuit diagram showing a part of the level shift block of in FIG. 5. In FIG. 6, a level shift circuit LS is one of the level shift circuits of the level shift block that corresponds to decoding signals DRAk0-DRAkx. The other level shift circuits may have the same construction as the level shift circuit LS shown in FIG. 6. The level shift circuit LS outputs a decoding signal DRA0k0, in response to a decoding signal DRAk0 and a block selecting signal BLK0. The decoding signal DRAk0 and the block selecting signal BLK0 may have an internal power supply voltage IVC or an external power supply voltage EVC, for example during the active state. The decoding signal DRA0k0 may have a high voltage VPP during the active state. The level shift circuit LS may include two PMOS transistors MP20 and MP21, four NMOS transistors MN20, MN21, MN22, and MN23, an inverter INV20, and a NAND G20, for example.

PMOS transistors MP20 and MP21 each may have a relatively thick gate insulation layer, so as to have a sufficient withstand voltage relative to a high voltage. Each of NMOS transistors MN20-MN23 may have a relatively thin gate insulation layer, so as to have a sufficient withstand voltage relative to one of an internal power supply voltage IVC and an external power supply voltage EVC, for example. Although not shown in FIG. 6, NMOS transistors constituting the NAND gate G20 and the inverter INV20 may also have a relatively thin gate insulation layer, so as to have a sufficient withstand voltage relative to an internal power supply voltage IVC or an external power supply voltage EVC.

PMOS transistor MP20 has a gate coupled to node ND21, a source coupled to a high voltage VPP, and a drain coupled to node ND20 (output terminal DRA0k0). PMOS transistor MP21 has a gate coupled to node ND20, a source coupled to a high voltage VPP, and a drain coupled to node ND21. The NMOS transistors MN20 and MN22 may be serially coupled between node ND20 and a ground voltage VSS. The NMOS transistors MN21 and MN23 may be serially coupled between ND21 and a ground voltage VSS. Gates of the MOS transistors MN20 and 21 may be connected to internal power supply voltage IVC and to external power supply voltage EVC. NMOS transistor MN22 may be controlled by a clock signal NOUT of a NAND gate G20 operating in response to the decoding signal DRAk0 and the block selecting signal BLK0. Inverter INV20 inverts an output signal of the NAND gate G20. NMOS transistor MN23 is controlled by an output signal of the inverter INV20.

In operation, when at least one of the decoding signal DRA0k and the block selecting signal BLK0 is at a low level, NMOS transistor MN22 is turned on and NMOS transistor MN23 is turned off. Accordingly, the node ND20 has a low level through NMOS transistors MN20 and MN22. As PMOS transistor MP21 is turned on, node ND21 is of a high voltage VPP and PMOS transistor MP20 is turned off. Although the node ND21 is at the high voltage VPP, NMOS transistors MN21 and MN23 (each having relatively thin gate insulation layers) are not affected by the high voltage VPP. This is because a gate-drain voltage difference of the NMOS transistor MN21 (where its gate is coupled to IVC/EVC) is VPP-IVC/EVC, and the gate-drain voltage difference of NMOS transistor MN23 is IVC/EVC-Vtn1.

When the decoding signal DRA0k and the block selecting signal BLK0 are at a high level, NMOS transistor MN22 is turned off and NMOS transistor MN23 is turned on. Accordingly, node ND21 is at a low level through NMOS transistors MN21 and MN23. As PMOS transistor MP20 is turned on, node ND20 is at high voltage VPP, and PMOS transistor MP21 is turned off. An output signal DRA0k0 (including block selecting information) has a high voltage VPP. Although node ND20 is at high voltage VPP, NMOS transistors MN20 and MN22 (each having a relatively thin gate insulation layer) are not affected by the high voltage VPP. This is because a gate-drain voltage difference of NMOS transistor MN20 (having its gate coupled to IVC/EVC) is VPP-IVC/EVC, and a gate-drain voltage difference of NMOS transistor MN22 is IVC/EVC-Vtn1.

In this exemplary embodiment, PMOS transistors MP20 and MP21 may constitute a 'first internal circuit' operating with a high voltage VPP. The NAND gate G20, inverter INV20, and NMOS transistors MN22 and MN23 may constitute a 'second internal circuit' operating with an internal power supply voltage IVC and an external power supply voltage EVC. NMOS transistors MN20 and MN21 may constitute means for restricting a voltage transmitted from the first internal circuit to the second internal circuit, for example.

Figure 7:
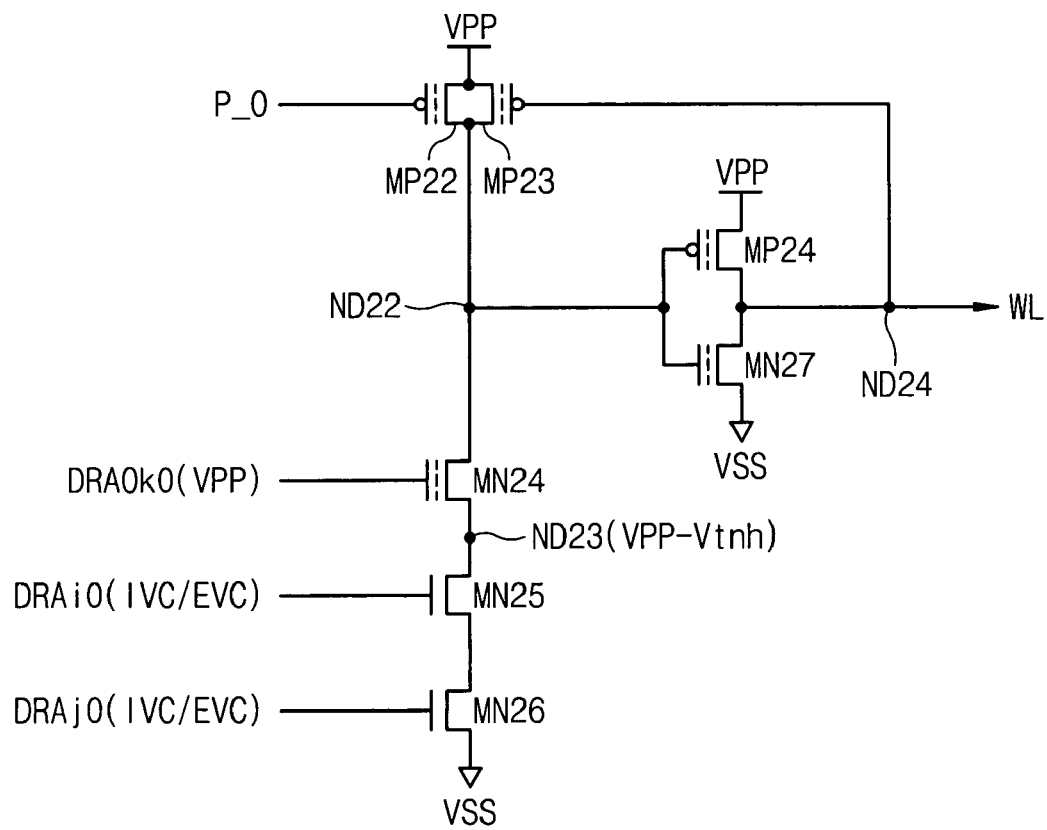
FIG. 7 is a circuit diagram showing a portion of a row decoder and driving block shown in FIG. 5.

FIG. 7 is a circuit diagram showing a part of the row decoder and driver block of FIG. 5. A row decoder and driver circuit 131 of FIG. 7 may be coupled to one of a plurality of word lines, each word line corresponding to a row decoder and driver block 130_0~130_y. Each row decoder and driver circuit may have the same construction as the row decoder and driver circuit shown in FIG. 7. The circuit 131 drives a corresponding word line in response to decoding signals (e.g., DRA0k0, DRAi0, and DRAj0). A decoding signal DRA0k0 is input from a corresponding level shift block at a high level of a high voltage during an active state of the device employing circuit 131. The decoding signals DRAi0 and DRAj0 are input from the row predecoder 120 of FIG. 5, and may have either an internal power supply voltage IVC or an external power supply voltage EVC during the active state, for example.

Referring to FIG. 7, the row decoder and driver circuit 131 may include PMOS transistors MP22, MP23 and MP24 and NMOS transistors MN24, MN25, MN26 and MN27. PMOS transistor MP22 has a gate connected to receive a control signal P_0, a source coupled to a high voltage VPP, and a drain coupled to an internal node ND22. The NMOS transistors MN24-MN26 may be serially coupled between the internal node ND22 and a ground voltage VSS, and are controlled by corresponding decoding signals DRA0k0, DRAi0, and DRAj0. PMOS transistor MP23 has a gate coupled to an output terminal ND24, a source coupled to a high voltage VPP, and a drain coupled to an internal node ND22. PMOS transistor MP24 and NMOS transistor MN27 may constitute an inverter, and are coupled between the internal node ND22 and the output terminal ND24 (i.e., a word line WL).

In operation, when the control signal P_0 is at a low level and at least one of the decoding signals DRA0k0, DRAi0, and DRAj0 is at a low level, a current path between the internal node ND22 and the ground voltage VSS is cut off, and a current path is formed between the internal node ND22 and the high voltage VPP. Since the PMOS transistor MP22 is turned on, the node ND22 has a high level of a high voltage VPP. Therefore, the wordline WL has a low level. Since the NMOS transistor MN24 has a relatively thick gate insulation layer even though the decoding signal DRA0k0 has a low level, the gate insulation layer of the NMOS transistor MN24 is not affected by the high voltage VPP of the node ND22. Although the decoding signal DRA0k0 has a high level of the high voltage VPP and the decoding signal DRA10 has a low level of the ground voltage VSS, the gate insulation layer of the NMOS transistor MN25 is not affected by the high voltage VPP. This is because the internal node ND23 has a voltage of VPP-Vtnh. The "Vtnh" means a threshold voltage of the NMOS transistor having a relatively thick gate insulation layer and is, for example, 2 Vtn1.

When the control signal P_0 has a high level of a high voltage VPP and all decoding signals DRA0k0, DRAi0, and DRAj0 are at a high level, a current path between the high voltage VPP and the internal node ND22 is open while a current path is formed between the internal node ND22 and the ground voltage VSS. Accordingly, the word line WL is driven with the high voltage VPP through PMOS transistor MP24. Since the high voltage VPP of node ND22 is transmitted through NMOS transistor MN24 (serving as an interface or voltage restricting means), a gate insulation layer of the NMOS transistor MN27 is not affected by the high voltage VPP.

Figure 8:
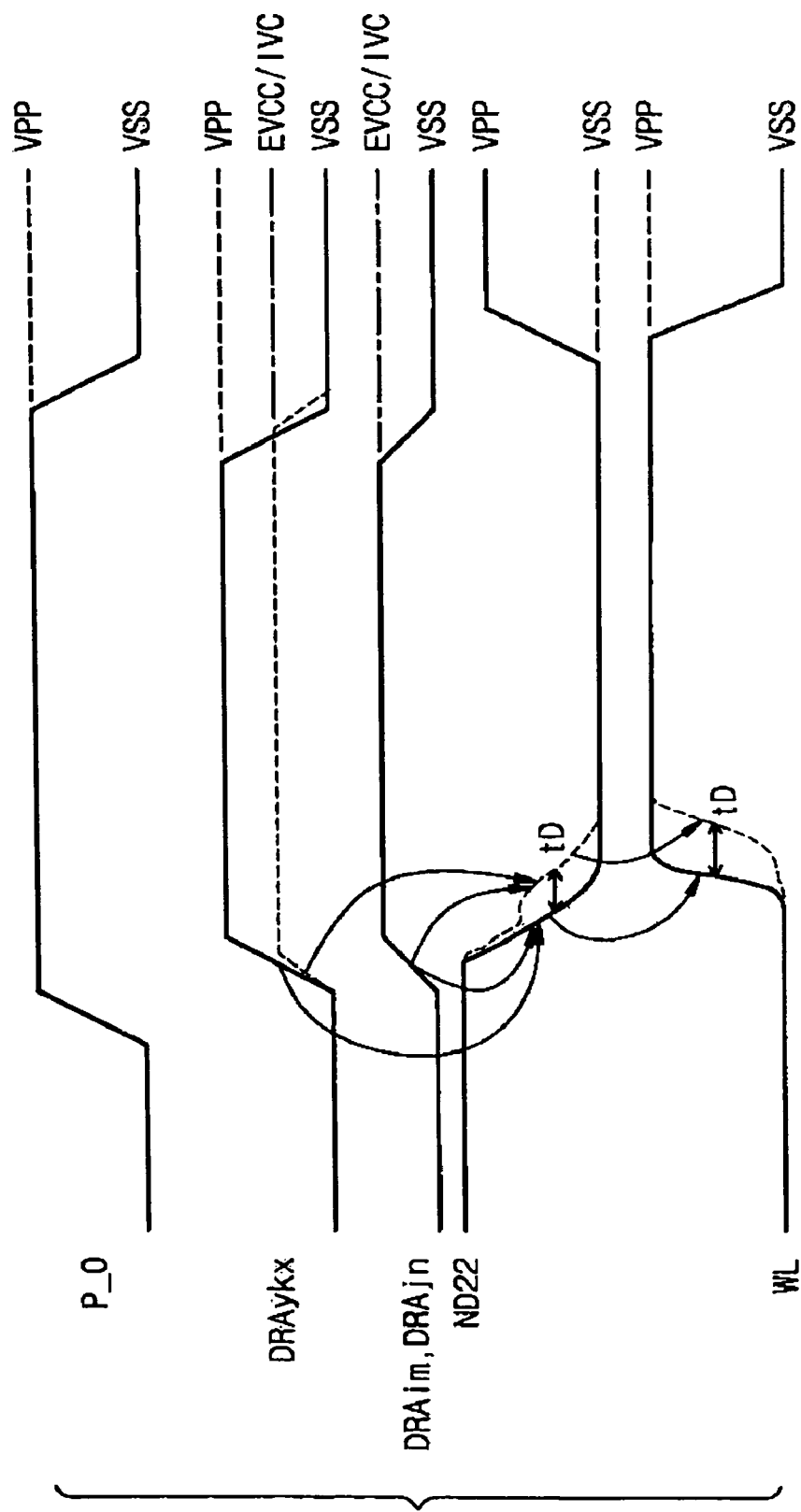
FIG. 8 is a timing diagram for explaining a read operation of the semiconductor memory device according to an exemplary embodiment of the present invention.

FIG. 8 is a timing diagram for explaining a read operation of a semiconductor memory device according to an exemplary embodiment of the present invention. In operation, when a control signal P_0 and decoding signals DRAykx, DRAim, and DRAjn are at a high level, the PMOS transistor MP22 shown in FIG. 7 is turned on and the NMOS transistors MN24-MN26 shown in FIG. 7 are turned off. Accordingly, word lines go to a low level.

As shown in FIG. 8, as the control signal P_0 goes to a high level, the PMOS transistor MP23 shown in FIG. 7 is turned off. Block selecting signals BLK[0:y] and decoding signals DRAk[0:x] are input to corresponding level shift blocks LSB0-LSBj. A level shift block corresponding to a selected memory block shifts a voltage level of decoding signals having a high level of IVC/EVC to a high voltage VPP. As shown in FIG. 8, high-level decoding signals output from the level shift block have a high voltage VPP, instead of an internal power supply voltage IVC or an external power supply voltage EVC, through corresponding level shift circuits (see FIG. 6). Thereafter, one of the row decoder and driver circuits in a selected memory block operates a word line WL with a high voltage VPP in response to the input signals DRAykx, DRAim, and DRAjn.

As previously stated, a MOS transistor (such as NMOS transistor MN24 of FIG. 7) having a relatively thick gate insulation layer may be used for preventing a gate insulation layer from being broken by a high voltage in an integrated circuit employing a dual insulation system. In the case where a voltage applied to the gate of the NMOS transistor MN24 is an internal power supply voltage IVC or an external power supply voltage EVC, the high voltage VPP of node ND22 shown in FIG. 7 may be discharged along a dotted line of FIG. 8. This is because it is difficult to sufficiently turn on the NMOS transistor having the relatively thick gate insulation layer by using IVC/EVC. As a result, the activation speed of the word line WL is lowered.

In case of the semiconductor memory device according to the invention, however, the gate voltage of the NMOS transistor MN24 is set to a high voltage to turn on the NMOS transistor MN24 having the relatively thick gate insulation layer in a sufficiently high speed. Thus, a discharge speed of the ND22 voltage of the row decoder and driver circuit 131 makes higher by tD, as shown in FIG. 8. As a result, the activation speed of the word line WL becomes higher by tD.

Figure 9:
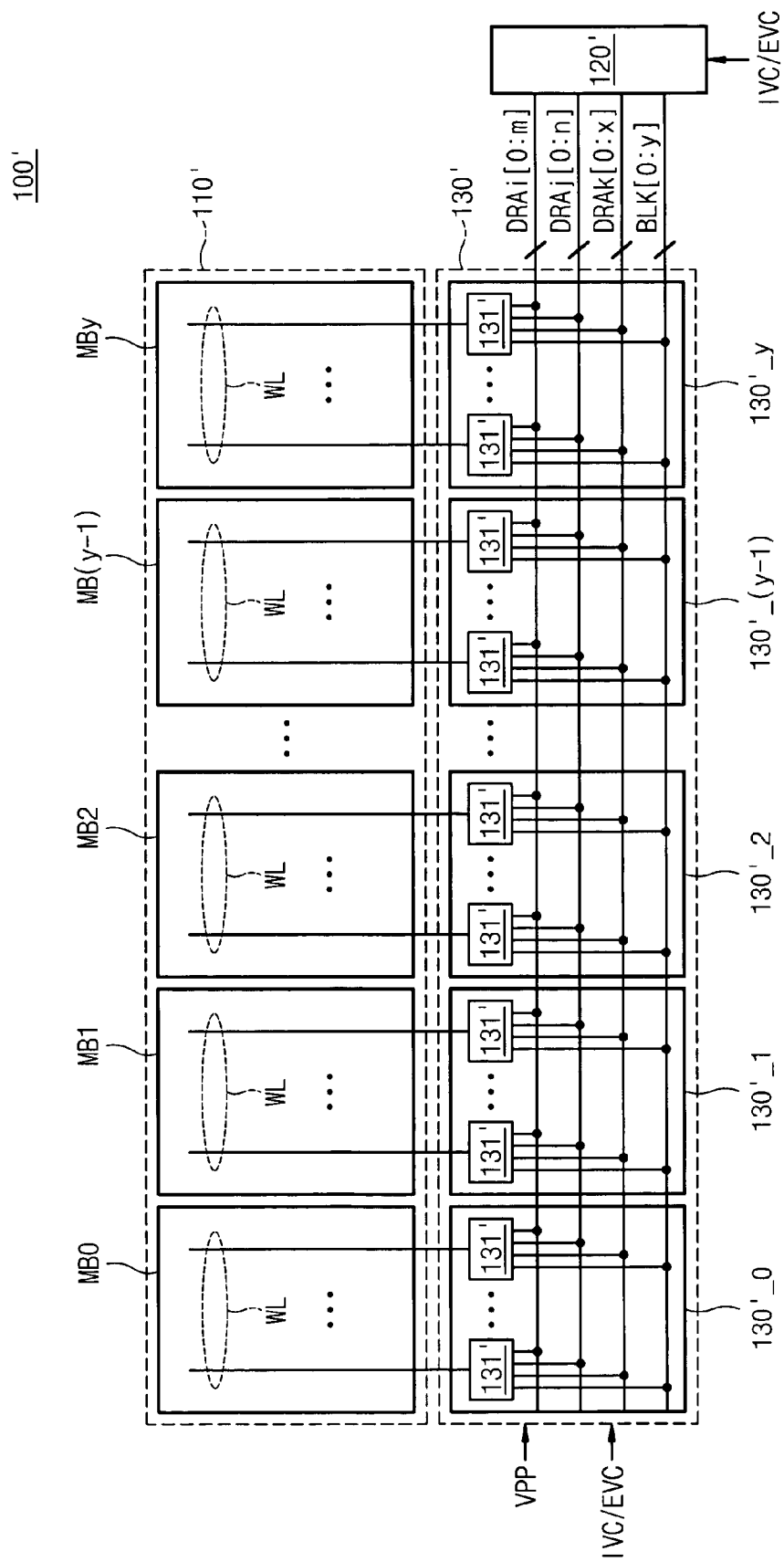
FIG. 9 is a block diagram of a semiconductor memory device according to another exemplary embodiment of the present invention.
Figure 10:
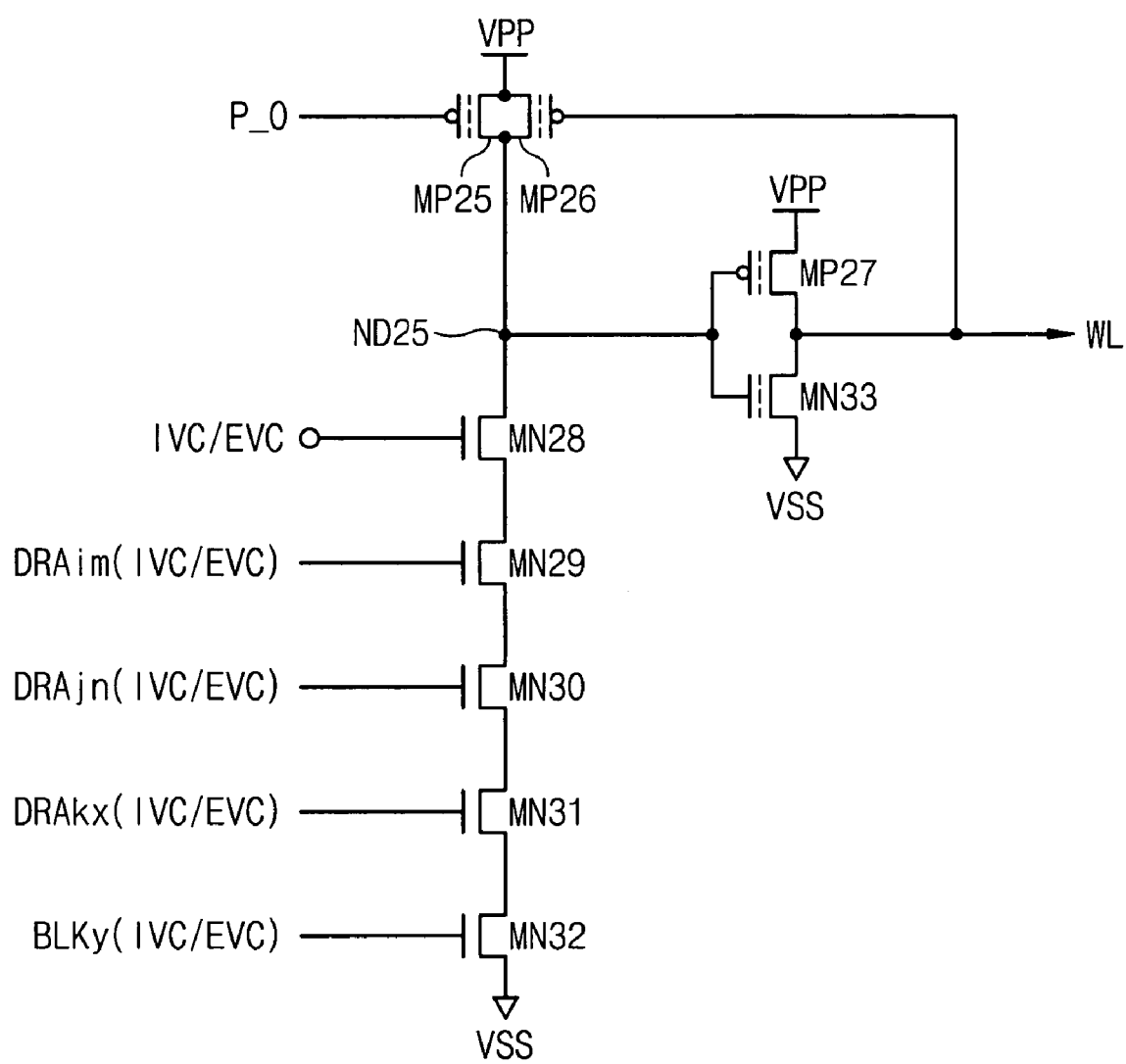
FIG. 10 is a circuit diagram showing a portion of a row decoder and driving block shown in FIG. 9.

FIG. 9 is a block diagram of a semiconductor memory device according to another exemplary embodiment of the present invention, and FIG. 10 is a circuit diagram showing a portion of a row decoder and driving block of FIG. 9.

Unlike the row decoder and driver blocks shown in FIG. 5, row decoder and driver blocks 130'_0~130'_y of FIG. 10 receive output signals directly from a row predecoder 120' (the output signals do not go through corresponding level shift blocks LSB0 . . . LSBy). The row decoder and driver blocks of FIG. 10 have a dual insulation system so as to operate with a high voltage VPP and an internal power supply voltage IVC or an external power supply voltage EVC.

Referring to FIG. 10, a given row decoder and driver block 131' may be coupled to any word line, drives the word line WL with a high voltage VPP in response to decoding signals DRAim, DRAjn, DRAkx, and BLKy. Each of the decoding signals has an internal power supply voltage IVC or an external power supply voltage EVC during the active state. The semiconductor memory device shown in FIG. 9 adopts the interface as shown in FIG. 3, but does not employ the level shift blocks of FIG. 5, for example.

The row decoder and driver circuit 131' may include PMOS transistor MP25, MP26 and MP27 and the NMOS transistors MN28, MN29, MN30, MN31, MN32 and MN33. Each of the transistors MP25, MP26, MP27 and MN33 may have a relatively thick gate insulation layer. Each of the transistors MN28-MN32 may have a relatively thin gate insulation layer. PMOS transistors MP25 and MP26 may constitute a first internal circuit operating with a high voltage VPP, and NMOS transistors MN29-MN32 may constitute a second internal circuit operating with an internal power supply voltage IVC or an external power supply voltage EVC. The NMOS transistor MN28 may act as an interface circuit (or voltage restricting means) for restricting a voltage applied from the first internal circuit to the second internal circuit. The row decoder and driver circuit of FIG. 10 operates the same as the integrated circuit device of FIG. 3, thus operation will not be explained in further detail.

As described above, since the high voltage VPP of the node ND25 is transmitted to the drain of the NMOS transistor MN29 through the NMOS transistor MN28, a gate-drain voltage difference of the NMOS transistor MN29 is IVC/EVC-Vtn1. Thus, although the NMOS transistor MN29 has a relatively thin gate insulation layer, the gate insulation layer of the NMOS transistor MN29 is not affected by the high voltage VPP. Since IVC/EVC is always applied to the gate of the NMOS transistor MN28, a gate-drain voltage difference of the NMOS transistor is VPP-IVC/EVC. Although the NMOS transistor MN28 has a relatively thin gate insulation layer, the gate insulation layer of the NMOS transistor MN28 is not broken by the high voltage VPP.

In accordance with the exemplary embodiments described above, an voltage IVC/EVC may be applied to a MOS transistor constituting an interface circuit or voltage restricting means. However, a gate voltage of this MOS transistor may be variously regulated so that a relatively thin gate insulation layer is not affected. To regulate the gate voltage, for example, a voltage between an internal (or external) power supply voltage and a high voltage or a voltage between an internal (or external) power supply voltage and a ground voltage may be used.

While the present invention has been set forth and described with respect to the above exemplary embodiments, it will be appreciated that other and different systems could readily be designed by those skilled in the art, without significantly departing from the spirit and scope of the exemplary embodiments of the present invention.

What is claimed is:

1. A semiconductor integrated circuit device, comprising:
a power terminal receiving a high voltage higher than a power supply voltage of the device;
a first MOS transistor coupled between the power terminal and a first internal node, the first internal node coupled to a row decoder and driver block of a memory device, and the row decoder and driver block selectively drives word lines of the memory device in response to a row address signal;

a second MOS transistor coupled between the power terminal and a second internal node, a third MOS transistor, having a relatively thin gate insulation layer, coupled between the first internal node and a third internal node;

a fourth MOS transistor, having a relatively thin gate insulation layer, coupled between the second internal node and a fourth internal node;

a fifth MOS transistor coupled between the third internal node and a ground voltage, the fifth MOS transistor controlled by a first input signal, and the first input signal includes the row address signal and a block selecting signal from the memory device; and a sixth MOS transistor coupled between the fourth internal node and the ground voltage, the sixth MOS transistor controlled by an inverted version of the first input signal.

2. The device of claim 1, wherein the first MOS transistor and the second MOS transistor each have a relatively thick gate insulation layer, and the fifth MOS transistor and sixth MOS transistor each have a relatively thin gate insulation layer.

3. The device of claim 1, wherein the power supply voltage is an external power supply voltage for the device or an internal power supply voltage of the device.

4. The device of claim 1, wherein the first MOS transistor is controlled by a voltage of the second internal node, and the second MOS transistor is controlled by a voltage of the first internal node.

5. The device of claim 1, wherein gates of the third and fourth MOS transistors are coupled to a low voltage that is lower than the high voltage.

6. The device of claim 5, wherein the power supply voltage is an external power supply voltage for the device or an internal power supply voltage of the device, and the low voltage is one of the power supply voltage, a voltage lower than the power supply voltage, and a voltage between the power supply voltage and the high voltage.

7. The device of claim 1, wherein the first input signal and its inverted version are selectable to have one of a high level of a low voltage and a low level of the ground voltage.

8. The device of claim 1, wherein the row decoder and driver block includes a plurality of row decoder and driver circuits, each row decoder and driver circuit corresponding to a given word line, and each row decoder and driver circuit further including:

a seventh MOS transistor having a source coupled to the high voltage, a drain coupled to a fifth internal node, and a gate connected to receive a second input signal; and eighth and ninth MOS transistors serially coupled between the fifth internal node and the ground voltage, wherein each of the seventh and eighth MOS transistors has a relatively thick gate insulation layer, and the ninth MOS transistor has a relatively thin gate insulation layer; and wherein the eighth MOS transistor is controlled by a voltage of the first internal node.

9. The device of claim 8, further comprising:

an inverter coupled to the corresponding fifth internal node, wherein the inverter drives the corresponding word line of each of the row decoder and driver circuits.

10. The device of claim 9, wherein the inverter includes PMOS and NMOS transistors, each PMOS or NMOS transistor operating at another voltage higher than the power supply voltage and having a relatively thick gate insulation layer.

* * * * *